United States Patent
Shin et al.

(10) Patent No.: US 11,226,558 B2
(45) Date of Patent: Jan. 18, 2022

(54) POSITIVE-TYPE PHOTOSENSITIVE RESIN COMPOSITION AND CURED FILM PREPARED THEREFROM

(71) Applicant: ROHM AND HAAS ELECTRONIC MATERIALS KOREA LTD., Chungcheongnam-do (KR)

(72) Inventors: Kahee Shin, Gyeonggi-do (KR); Eun-Young Lee, Gyeonggi-do (KR); Jong-Ho Na, Gyeonggi-do (KR); Geun Huh, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 136 days.

(21) Appl. No.: 16/664,994

(22) Filed: Oct. 28, 2019

(65) Prior Publication Data
US 2020/0142304 A1   May 7, 2020

(30) Foreign Application Priority Data
Nov. 6, 2018  (KR) .......... 10-2018-0135257

(51) Int. Cl.
| | | |
|---|---|---|
| *G03F 7/023* | (2006.01) | |
| *G03F 7/033* | (2006.01) | |
| *G03F 7/039* | (2006.01) | |
| *C08F 220/14* | (2006.01) | |
| *G03F 7/031* | (2006.01) | |

(52) U.S. Cl.
CPC .......... *G03F 7/0233* (2013.01); *C08F 220/14* (2013.01); *G03F 7/031* (2013.01); *G03F 7/033* (2013.01); *G03F 7/039* (2013.01)

(58) Field of Classification Search
CPC ...... G03F 7/022; G03F 7/0223; G03F 7/0226; G03F 7/023; G03F 7/0233; G03F 7/0236; G03F 7/027; G03F 7/028; G03F 7/029; G03F 7/031; G03F 7/032; G03F 7/033
See application file for complete search history.

(56) References Cited

U.S. PATENT DOCUMENTS

| | | | |
|---|---|---|---|
| 8,512,934 B2 * | 8/2013 | Hayoz ................. | G03F 7/0007 430/270.1 |
| 2002/0051929 A1 * | 5/2002 | Watanabe ............. | G03F 7/033 430/192 |
| 2018/0079864 A1 * | 3/2018 | Kawabata ........... | C08G 73/1067 |

FOREIGN PATENT DOCUMENTS

KR   2015-0127360 A   11/2015

\* cited by examiner

*Primary Examiner* — John S Chu
(74) *Attorney, Agent, or Firm* — G. Creston Campbell

(57) ABSTRACT

The present invention relates to a positive-type photosensitive resin composition and a cured film prepared therefrom. The composition comprises a photopolymerizable compound containing a double bond and a specific photopolymerization initiator, wherein the photopolymerizable compound containing a double bond suppresses the photopolymerization reaction upon exposure to light but causes the photopolymerization reaction at the time of photobleaching after development, thereby controlling the flowability of the composition during thermal curing. Thus, a pattern is readily formed, which makes it possible to maintain excellent sensitivity upon the development and even upon the hard-bake process after the development, and it is possible to provide a cured film that is excellent in film strength and film retention rate.

8 Claims, 1 Drawing Sheet

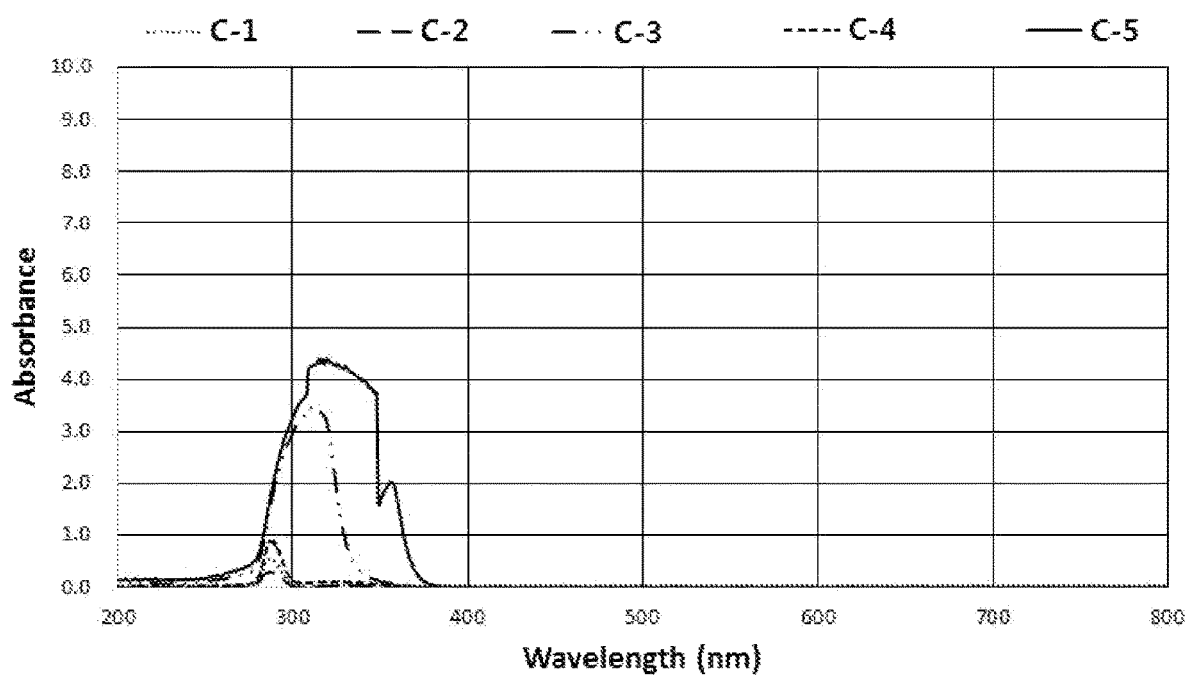

POSITIVE-TYPE PHOTOSENSITIVE RESIN COMPOSITION AND CURED FILM PREPARED THEREFROM

TECHNICAL FIELD

The present invention relates to a photosensitive resin composition and a cured film prepared therefrom. More specifically, the present invention relates to a positive-type photosensitive resin composition, which provides excellent film strength characteristics even after the development and curing, and a cured film prepared therefrom to be used in a liquid crystal display, an organic EL display, and the like.

BACKGROUND ART

Generally, a transparent planarization film is formed on a thin film transistor (TFT) substrate for the purpose of insulation to prevent a contact between a transparent electrode and a data line in a liquid crystal display or an organic EL display. Through a transparent pixel electrode positioned near the data line, the aperture ratio of a panel may be increased, and high luminance/resolution may be attained. In order to form such a transparent planarization film, several processing steps are employed to impart a specific pattern profile, and a positive-type photosensitive resin composition is widely employed in this process since fewer processing steps are required.

A conventional positive-type photosensitive resin composition has a problem of low hardness of a film due to a low degree of curing. In order to solve such a problem, a composition comprising a photopolymerizable compound having a double bond, which is capable of improving the hardness by causing a curing reaction in the composition, has been known (Korean Laid-open Patent Publication No. 2015-0127360). The photopolymerizable compound having a double bond, however, is not controlled in flowability during thermal curing, thereby causing a problem that the pattern hole is clogged at the time of pattern formation, resulting in a problem that the sensitivity is slow.

DISCLOSURE OF INVENTION

Technical Problem

Accordingly, in order to solve the above-mentioned problems, the present invention aims to provide a positive-type photosensitive resin composition that comprises a photopolymerizable compound having a double bond and a specific photopolymerization initiator, thereby controlling the flowability of the composition during exposure to light and thermal curing, while maintaining such physical properties as film retention rate and hardness, whereby a pattern is readily formed, which enhances the sensitivity; and a cured film prepared therefrom to be used in a liquid crystal display, an organic EL display, and the like.

Solution to Problem

In order to accomplish the above object, the present invention provides a positive-type photosensitive resin composition, which comprises (A) an acrylic copolymer; (B) a photopolymerizable compound containing a double bond; (C) a photopolymerization initiator; and (D) a 1,2-quinonediazide compound, wherein when the absorbance of the photopolymerization initiator (C) dissolved in propylene glycol methyl ether acetate (PGMEA) at a concentration of 0.5 mM is measured under the conditions of 23° C. and an optical path length of 10 mm, the maximum absorbance in the entire wavelength range is 4.0 or less.

In order to accomplish another object, the present invention provides a cured film prepared from the positive-type photosensitive resin composition.

Advantageous Effects of Invention

The positive-type photosensitive resin composition according to the present invention comprises a photopolymerizable compound containing a double bond and a specific photopolymerization initiator, wherein the photopolymerizable compound containing a double bond suppresses the photopolymerization reaction upon exposure to light but causes the photopolymerization reaction at the time of photobleaching after development, thereby controlling the flowability of the composition during thermal curing. Thus, a pattern is readily formed, which makes it possible to maintain excellent sensitivity upon the development and even upon the hard-bake process after the development, and it is possible to provide a cured film that is excellent in film strength and film retention rate.

BRIEF DESCRIPTION OF DRAWINGS

FIG. 1 is a graph showing the absorbance of a solution prepared by dissolving various photopolymerization initiators according to an Example in propylene glycol methyl ether acetate (PGMEA) at a concentration of 0.5 mM measured under the conditions of 23° C. and an optical path length of 10 mm.

BEST MODE FOR CARRYING OUT THE INVENTION

The present invention is not limited to those described below. Rather, it can be modified into various forms as long as the gist of the invention is not altered.

Throughout the present specification, when a part is referred to as "comprising" an element, it is understood that other elements may be comprised, rather than other elements are excluded, unless specifically stated otherwise. In addition, all numbers and expressions relating to quantities of components, reaction conditions, and the like used herein are to be understood as being modified by the term "about" unless specifically stated otherwise.

The present invention provides a positive-type photosensitive resin composition, which comprises (A) an acrylic copolymer; (B) a photopolymerizable compound containing a double bond; (C) a photopolymerization initiator; and (D) a 1,2-quinonediazide compound, wherein when the absorbance of the photopolymerization initiator (C) dissolved in propylene glycol methyl ether acetate (PGMEA) at a concentration of 0.5 mM is measured under the conditions of 23° C. and an optical path length of 10 mm, the maximum absorbance in the entire wavelength range is 4.0 or less. The composition may optionally further comprise (E) an epoxy compound; (F) an adhesion supplement; (G) a surfactant; and/or (H) a solvent.

Hereinafter, each component of the photosensitive resin composition will be explained in detail.

As used herein, the term "(meth)acryl" refers to "acryl" and/or "methacryl," and the term "(meth)acrylate" refers to "acrylate" and/or "methacrylate."

The weight average molecular weight (g/mole, Da) of each component as described below is measured by gel permeation chromatography (GPC, eluent: tetrahydrofuran) referenced to a polystyrene standard.

(A) Acrylic Copolymer

The positive-type photosensitive resin composition according to the present invention may comprise an acrylic copolymer (A).

The acrylic copolymer (A) may comprise (a-1) a structural unit derived from an ethylenically unsaturated carboxylic acid, an ethylenically unsaturated carboxylic anhydride, or a combination thereof; (a-2) a structural unit derived from an unsaturated compound containing an epoxy group; and (a-3) a structural unit derived from an ethylenically unsaturated compound different from the structural units (a-1) and (a-2).

The acrylic copolymer (A) is an alkali-soluble resin for materializing developability in the development step and also plays the role of a base for forming a film upon coating and a structure for forming a final pattern.

(a-1) Structural Unit Derived from an Ethylenically Unsaturated Carboxylic Acid, an Ethylenically Unsaturated Carboxylic Anhydride, or a Combination Thereof.

The structural unit (a-1) may be derived from an ethylenically unsaturated carboxylic acid, an ethylenically unsaturated carboxylic anhydride, or a combination thereof. The ethylenically unsaturated carboxylic acid, the ethylenically unsaturated carboxylic anhydride, or a combination thereof is a polymerizable unsaturated compound containing at least one carboxyl group in the molecule. It may be at least one selected from an unsaturated monocarboxylic acid such as (meth)acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid having three or more valences and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl]phthalate, and the like. But it is not limited thereto. (Meth)acrylic acid among the above is preferable from the viewpoint of developability.

The amount of the structural unit (a-1) may be 5 to 50% by mole, preferably 10 to 40% by mole, based on the total moles of the structural units constituting the acrylic copolymer (A). Within the above range, it is possible to attain a pattern formation of a film while maintaining favorable developability.

(a-2) Structural Unit Derived from an Unsaturated Compound Containing an Epoxy Group The structural unit (a-2) may be derived from an unsaturated monomer containing an epoxy group. Particular examples of the unsaturated monomer containing an epoxy group may include glycidyl (meth)acrylate, 4-hydroxybutyl acrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, 3,4-epoxycyclohexylmethyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl) acrylamide, N-(4-(2,3-epoxypropoxy)-3,5-dimethylphenylpropyl)acrylamide, allyl glycidyl ether, 2-methylallyl glycidyl ether, and a combination thereof. Glycidyl (meth) acrylate, 3,4-epoxycyclohexyl (meth)acrylate, 3,4-epoxycyclohexylmethyl (meth)acrylate, 4-hydroxybutyl acrylate glycidyl ether, or a combination thereof is preferable from the viewpoint of storage stability at room temperature and solubility.

The amount of the structural unit derived from an unsaturated compound containing an epoxy group (a-2) may be 1 to 45% by mole, preferably 3 to 30% by mole, based on the total number of moles of the structural units constituting the acrylic copolymer (A). Within the above range, the storage stability of the composition may be maintained, and the film retention rate upon post-bake may be advantageously enhanced.

(a-3) Structural Unit Derived from an Ethylenically Unsaturated Compound Different from the Structural Units (a-1) and (a-2)

The structural unit (a-3) may be derived from an ethylenically unsaturated compound different from the structural units (a-1) and (a-2). The ethylenically unsaturated compound different from the structural units (b-1) and (b-2) may be at least one selected from the group consisting of an ethylenically unsaturated compound having an aromatic ring such as phenyl (meth)acrylate, benzyl (meth)acrylate, 2-phenoxyethyl (meth)acrylate, phenoxy diethylene glycol (meth)acrylate, p-nonylphenoxy polyethylene glycol (meth) acrylate, p-nonylphenoxy polypropylene glycol (meth)acrylate, tribromophenyl (meth)acrylate, styrene, methylstyrene, dimethylstyrene, trimethylstyrene, ethylstyrene, diethylstyrene, triethylstyrene, propylstyrene, butylstyrene, hexylstyrene, heptylstyrene, octylstyrene, fluorostyrene, chlorostyrene, bromostyrene, iodostyrene, methoxystyrene, ethoxystyrene, propoxystyrene, p-hydroxy-α-methylstyrene, acetylstyrene, vinyl toluene, divinylbenzene, vinylphenol, o-vinylbenzyl methyl ether, m-vinylbenzyl methyl ether, and p-vinylbenzyl methyl ether; an unsaturated carboxylic acid ester such as (meth)acrylate, methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, dicyclopentenyloxyethyl (meth)acrylate, glycidyl (meth)acrylate, 3,4-epoxybutyl (meth)acrylate, 4,5-epoxypentyl (meth)acrylate, 5,6-epoxyhexyl (meth)acrylate, and 6,7-epoxyheptyl (meth)acrylate; an N-vinyl tertiary amine containing an N-vinyl group such as N-vinyl pyrrolidone, N-vinyl carbazole, and N-vinyl morpholine; an unsaturated ether such as vinyl methyl ether and vinyl ethyl ether; and an unsaturated imide such as N-phenylmaleimide, N-(4-chlorophenyl)maleimide, N-(4-hydroxyphenyl)maleimide, and N-cyclohexylmaleimide.

The amount of the structural unit (a-3) may be 5 to 70% by mole, preferably 15 to 65% by mole, based on the total number of moles of the structural units constituting the acrylic copolymer (A). Within the above amount range, it is possible to control the reactivity of the acrylic copolymer (i.e., an alkali-soluble resin) and to increase the solubility thereof in an aqueous alkaline solution, so that the coatability of the photosensitive resin composition can be remarkably enhanced.

The acrylic copolymer (A) may be prepared by compounding each of the compounds that provide the structural units (a-1), (a-2), and (a-3), and adding thereto a molecular weight controlling agent, a polymerization initiator, a solvent, and the like, followed by charging nitrogen thereto and slowly stirring the mixture for polymerization. The molecular weight controlling agent may be a mercaptan compound such as butyl mercaptan, octyl mercaptan, lauryl mercaptan, or the like, or an α-methylstyrene dimer, but it is not particularly limited thereto.

The polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide; lauryl peroxide; t-butyl peroxypivalate; 1,1-bis(t-butylperoxy)cyclohexane, or the like, but it is not limited thereto. The polymerization initiator may be used alone or in combination of two or more thereof.

In addition, the solvent may be any solvent commonly used in the preparation of an acrylic copolymer (A). It may preferably be methyl 3-methoxypropionate or propylene glycol monomethyl ether acetate (PGMEA).

In particular, it is possible to reduce the residual amount of unreacted monomers by keeping the reaction time longer while maintaining the reaction conditions to be milder during the polymerization reaction.

The reaction conditions and the reaction time are not particularly limited. For example, the reaction temperature may be adjusted to a temperature lower than the conventional temperature, for example, from room temperature to 60° C. or from room temperature to 65° C. Then, the reaction time is to be maintained until a sufficient reaction takes place.

It is possible to reduce the residual amount of unreacted monomers in the acrylic copolymer (A) to a very minute level when the acrylic copolymer (A) is prepared by the above process.

Here, the term unreacted monomers (or residual monomers) of the acrylic copolymer (A) as used herein refers to the amount of the compounds (i.e., monomers) that aim to provide the structural units (a-1) to (a-3) of the acrylic copolymer (A), but do not participate in the reaction (i.e., do not form a chain of the copolymer).

Specifically, the amount of unreacted monomers of the acrylic copolymer (A) remaining in the photosensitive resin composition of the present invention may be 2 parts by weight or less, preferably 1 part by weight or less, based on 100 parts by weight of the copolymer (on the basis of solids content).

Here, the term solids content refers to the amount of the composition, exclusive of solvents.

The weight average molecular weight (Mw) of the copolymer thus prepared may be in the range of 500 to 50,000 Da, preferably 5,000 to 20,000 Da, when determined by gel permeation chromatography (eluent: tetrahydrofuran) referenced to a polystyrene standard. Within the above range, the developability is appropriately controlled, which is advantageous in terms of film retention and sensitivity.

The acrylic copolymer (A) may have an acid value of 10 to 40 mg KOH/g, 10 to 35 mg KOH/g, or 20 to 35 mg KOH/g.

The acrylic copolymer (A) may be employed in an amount of 50 to 95% by weight, preferably 60 to 90% by weight, based on the total weight of the photosensitive resin composition on the basis of the solids content, exclusive of solvents. Within the above range, the developability is appropriately controlled, which is advantageous in terms of the film retention and the resolution of a pattern.

(B) Photopolymerizable Compound Containing a Double Bond

The photopolymerizable compound (B) employed in the present invention is a compound that has a double bond and is polymerizable by the action of a photopolymerization initiator. Specifically, it may be a monofunctional or polyfunctional ester compound having at least one ethylenically unsaturated double bond. In particular, it may be a polyfunctional compound having at least two functional groups from the viewpoint of chemical resistance.

The photopolymerizable compound containing a double bond (B) may be selected from the group consisting of ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth)acrylate, trimethylolpropane tri(meth)acrylate, pentaerythritol tri(meth)acrylate, a monoester of pentaerythritol tri(meth)acrylate and succinic acid, pentaerythritol tetra(meth)acrylate, dipentaerythritol penta(meth)acrylate, dipentaerythritol hexa(meth)acrylate, a monoester of dipentaerythritol penta(meth)acrylate and succinic acid, a caprolactone-modified dipentaerythritol hexa(meth)acrylate, pentaerythritol triacrylate-hexamethylene diisocyanate (a reaction product of pentaerythritol triacrylate and hexamethylene diisocyanate), tripentaerythritol hepta(meth)acrylate, tripentaerythritol octa(meth)acrylate, bisphenol A epoxyacrylate, and ethylene glycol monomethyl ether acrylate, and a mixture thereof, but it is not limited thereto.

Examples of the photopolymerizable compound (B) commercially available may include (i) monofunctional (meth)acrylate such as Aronix M-101, M-111, and M-114 manufactured by Toagosei Co., Ltd., KAYARAD T4-110S and T4-120S manufactured by Nippon Kayaku Co., Ltd., and V-158 and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri- and higher functional (meth)acrylate such as Aronix M-309, M-400, M-403, M-405, M-450, M-7100, M-8030, M-8060, and TO-1382 manufactured by Toagosei Co., Ltd., KAYARAD TMPTA, DPHA, DPHA-40H, DPCA-20, DPCA-30, DPCA-60, and DPC1-120 manufactured by Nippon Kayaku Co., Ltd., and V-295, V-300, V-360, V-GPT, V-3PA, V-400, and V-802 manufactured by Osaka Yuki Kayaku Kogyo Co., Ltd.

The photopolymerizable compound (B) may be employed in an amount of 2 to 50 parts by weight or 5 to 20 parts by weight based on 100 parts by weight of the acrylic copolymer (A) on the basis of the solids content. Within the above range, the developability and the degree of crosslinking are appropriately controlled, which is advantageous in terms of the film retention and the resolution of a pattern. If it is used in an amount smaller than the above range, the degree of crosslinking is not sufficiently increased, whereby the strength of a cured film is not high. If it is excessively used, there may occur a problem that the flow of the composition is caused during the hard-bake (i.e., the flowability is increased), whereby the resolution of a pattern is deteriorated.

(C) Photopolymerization Initiator

The photopolymerization initiator (C) used in the present invention serves to initiate polymerization of monomers that can be cured by visible light, ultraviolet light, deep-ultraviolet radiation, or the like. The photopolymerization initiator may be a radical initiator. When it is dissolved in propylene glycol methyl ether acetate (PGMEA) at a concentration of 0.5 mM, the maximum absorbance may be 4.0 or less. Specifically, when the absorbance of the photopolymerization initiator (C) dissolved in propylene glycol methyl ether acetate (PGMEA) at a concentration of 0.5 mM is measured under the conditions of 23° C. and an optical path length of 10 mm (i.e., the thickness of the solution through which light passes), the maximum absorbance in the entire wavelength range is 4.0 or less, 0.01 to 4.0, or 0.1 to 4.0.

According to an example, the photopolymerization initiator (C) may be a compound represented by the following Formula 1:

[Formula 1]

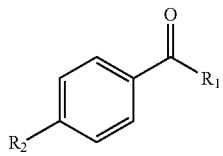

In the above Formula 1, $R_1$ is $C_{1-20}$ alkyl, $C_{3-20}$ cycloalkyl, $C_{6-30}$ aryl, or $C_{1-20}$ hydroxyalkyl, wherein when $R_1$ is an alkyl group, a cycloalkyl group, an aryl group, or a hydroxyalkyl group, some or all of the hydrogen atoms may be substituted with a $C_{1-20}$ alkyl group or a hydroxy group, $R_2$ is hydrogen or

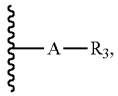

A is $C_{1-10}$ alkylene or oxygen, $R_3$ is $C_{1-20}$ alkyl, $C_{3-20}$ cycloalkyl, $C_{6-30}$ aryl, or $C_{1-20}$ hydroxyalkyl, wherein when $R_3$ is an alkyl group, a cycloalkyl group, an aryl group, or a hydroxyalkyl group, some or all of the hydrogen atoms may be substituted with a $C_{1-20}$ alkyl group, a hydroxy group, or a $C_{1-20}$ hydroxyalkylcarbonyl group.

Specifically, $R_1$ is $C_{1-10}$ alkyl, $C_{6-20}$ aryl, or $C_{1-10}$ hydroxyalkyl, wherein when $R_1$ is an alkyl group, a cycloalkyl group, an aryl group, or a hydroxyalkyl group, some or all of the hydrogen atoms may be substituted with a $C_{1-10}$ alkyl group or a hydroxy group, A is $C_{1-10}$ alkylene or oxygen, $R_3$ is $C_{1-10}$ alkyl, $C_{3-15}$ cycloalkyl, $C_{6-20}$ aryl, or $C_{1-15}$ hydroxyalkyl, wherein when $R_3$ is an alkyl group, a cycloalkyl group, an aryl group, or a hydroxyalkyl group, some or all of the hydrogen atoms may be substituted with a $C_{1-20}$ alkyl group, a hydroxy group, or a $C_{1-20}$ hydroxyalkylcarbonyl group.

More specifically, $R_1$ is

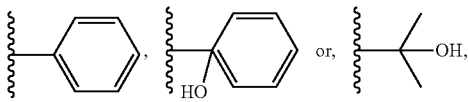

A is —$CH_2$— or oxygen, and $R_3$ may be

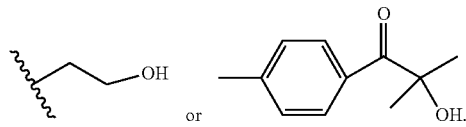

According to an example, the photopolymerization initiator (C) may be selected from the group consisting of an acetophenone-based, benzophenone-based, benzoin-based, benzoyl-based, ketal-based, xanthone-based, triazine-based, halomethyloxadiazole-based, and rofindimer-based photopolymerization initiators.

Examples of the photopolymerization initiator (C) may include 2,2'-azobis(2,4-dimethylvaleronitrile), 2,2'-azobis(4-methoxy-2,4-dimethylvaleronitrile), benzoyl peroxide, lauryl peroxide, t-butyl peroxy pivalate, 1,1-bis(t-butylperoxy)cyclohexane, p-dimethylaminoacetophenone, 2-benzyl-2-(dimethylamino)-1-[4-(4-morpholinyl)phenyl]-1-butanone, 1-hydroxy-cyclohexyl-phenyl ketone, 2-hydroxy-2-methyl-1-phenyl-propan-1-one, 2-hydroxy-1-[4-(2-hydroxyethoxy)phenyl]-2-methyl-propanone, 2-hydroxy-1-(4-(4-(2-hydroxy-2-methylpropionyl)benzyl)phenyl)-2-methylpropane-1-on, benzyl dimethyl ketal, benzophenone, benzoin propyl ether, diethyl thioxanthone, 2,4-bis(trichloromethyl)-6-p-methoxyphenyl-s-triazine, 2-trichloromethyl-5-styryl-1,3,4-oxodiazole, 9-phenylacridine, 3-methyl-5-amino-((s-triazin-2-yl)amino)-3-phenylcoumarin, 2-(o-chlorophenyl)-4,5-diphenylimidazolyl dimer, 2,4,6-trimethylphenylcarbonyl-diphenylphosphonyloxide, hexafluorophosphoro-trialkylphenylsulfonium salts, 2-mercaptobenzimidazole, 2,2'-benzothiazolyl disulfide, and a mixture thereof, but it is not limited thereto.

The photopolymerization initiator (C) may be employed in an amount of 1 to 30 parts by weight or 2 to 20 parts by weight based on 100 parts by weight of the acrylic copolymer (A) on the basis of the solids content. Within the above range, it is advantageous in that the sensitivity is high and the resolution of a pattern is excellent. If it is less than 2 parts by weight, the resolution of a pattern is deteriorated. If it exceeds 20 parts by weight, it is disadvantageous in terms of the film retention.

(D) 1,2-Quinonediazide-Based Compound

The positive-type photosensitive resin composition according to the present invention may further comprise a 1,2-quinonediazide-based compound (D).

The 1,2-quinonediazide compound (D) is used in combination with the acrylic copolymer (A) to improve the pattern formation and the transparency of a cured film; therefore, it can be used as needed.

The 1,2-quinonediazide-based compound may be a compound used as a photosensitive agent in the photoresist field.

Examples of the 1,2-quinonediazide-based compound (D) include an ester of a phenolic compound and 1,2-benzoquinonediazide-4-sulfonic acid or 1,2-benzoquinonediazide-5-sulfonic acid; an ester of a phenolic compound and 1,2-naphthoquinonediazide-4-sulfonic acid or 1,2-naphthoquinonediazide-5-sulfonic acid; a sulfonamide of a phenolic compound in which the hydroxyl group is substituted with an amino group and 1,2-benzoquinonediazide-4-sulfonic acid or 1,2-benzoquinonediazide-5-sulfonic acid; a sulfonamide of a phenolic compound in which the hydroxyl group is substituted with an amino group and 1,2-naphthoquinonediazide-4-sulfonic acid or 1,2-naphthoquinonediazide-5-sulfonic acid. The above compounds may be used alone or in combination of two or more thereof.

Examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, 2,2,4-trimethyl-7,2',4'-trihydroxyflavane, and the like.

More particular examples of the 1,2-quinonediazide-based compound (D) include an ester of 2,3,4-trihydroxybenzophenone and 1,2-naphthoquinonediazide-4-sulfonic acid, an ester of 2,3,4-trihydroxybenzophenone and 1,2-naphthoquinonediazide-5-sulfonic acid, an ester of 4,4'-[1-[4-[1-[4-hydroxyphenyl]-1-methylethyl]phenyl]ethylidene]bisphenol and 1,2-naphthoquinonediazide-4-sulfonic acid, an ester of 4,4'-[1-[4-[1-[4-hydroxyphenyl]-1-methylethyl]phenyl]ethylidene]bisphenol and 1,2-naphthoquinonediazide-5-sulfonic acid, and the like. The above compounds may be used alone or in combination of two or more thereof. If the above compounds are used, the transparency of the photosensitive resin composition may be enhanced.

The 1,2-quinonediazide-based compound (D) may be employed in an amount of 2 to 50 parts by weight or 5 to 20 parts by weight based on 100 parts by weight of the acrylic copolymer (A) on the basis of the solids content. Within the above content range, a pattern is more readily formed, and it is possible to achieve high sensitivity and excellent film retention characteristics.

(E) Epoxy Compound

The positive-type photosensitive resin composition according to the present invention may further comprise an epoxy compound (E). The epoxy compound (E) serves to increase the internal density of the acrylic copolymer (A). Thus, it is possible to improve the chemical resistance of a cured film to be prepared therefrom comprising them.

The epoxy compound (E) may be a homo-oligomer or a hetero-oligomer of an unsaturated monomer containing at least one epoxy group.

Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, 3,4-epoxycyclohexylmethyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, and a mixture thereof. Preferably, glycidyl methacrylate may be used.

The epoxy compound (E) may be synthesized by any methods well known in the art.

An example of the commercially available epoxy compound (E) may be GHP24HP (3,4-epoxycyclohexylmethyl methacrylate homopolymer, Miwon Commercial Co., Ltd.).

The epoxy compound (E) may further comprise the following structural unit.

Particular examples thereof may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the compounds exemplified above may be contained in the epoxy compound (E) alone or in combination of two or more thereof. The styrene-based compounds among the above compounds may be preferable in consideration of polymerizability.

In such event, the epoxy compound (E) does not contain a structural unit derived from a monomer having a carboxyl group. That is, it is more preferable in terms of the chemical resistance that the epoxy compound (E) does not contain a carboxyl group.

The structural unit may be contained in an amount of 0 to 70% by mole, preferably 10 to 60% by mole, based on the total number of moles of the structural units constituting the epoxy compound (E). Within the above content range, it may be more advantageous in terms of the film strength.

The weight average molecular weight of the epoxy compound (E) may be 100 to 30,000 Da or 1,000 to 15,000 Da. If the weight average molecular weight of the epoxy compound is at least 100 Da, the hardness of a cured film may be more favorable. If it is 30,000 Da or less, a cured film may have a uniform thickness, which is suitable for planarizing any steps thereon.

The smaller the amount of the epoxy compound (E), the lower the film strength. The larger the amount thereof, the lower the sensitivity. Thus, it is important to use the epoxy compound (E) in an appropriate amount. Specifically, the epoxy compound (E) may be employed in an amount of 0 to 40 parts by weight or 2 to 20 parts by weight based on 100 parts by weight of the acrylic copolymer (A) on the basis of the solids content. Within the above content range, the film strength and the sensitivity are excellent.

(F) Adhesion Supplement

The photosensitive resin composition of the present invention may further comprise an adhesion supplement (F) to enhance the adhesiveness to a substrate.

The adhesion supplement (F) may have at least one reactive group selected from the group consisting of a carboxyl group, a (meth)acryloyl group, an isocyanate group, an amino group, a mercapto group, a vinyl group, and an epoxy group.

The kind of the adhesion supplement (F) is not particularly limited. It may be at least one selected from the group consisting of trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, N-phenylaminopropyltrimethoxysilane, and β-(3,4-epoxycyclohexyl)ethyltrimethoxysilane. Preferred is γ-glycidoxypropyltrimethoxysilane, γ-glycidoxypropyltriethoxysilane, or N-phenylaminopropyltrimethoxysilane, which is capable of enhancing the film retention rate and is excellent in the adhesiveness to a substrate.

The adhesion supplement (F) may be employed in an amount of 0.01 to 5 parts by weight or 0.1 to 3 parts by weight based on 100 parts by weight of the acrylic copolymer (A) on the basis of the solids content. Within the above content range, a pattern is more readily formed, and it is possible to prevent such a pattern shape as scum appearing at the bottom portion of the pattern upon development.

(G) Surfactant

The positive-type photosensitive resin composition of the present invention may further comprise a surfactant (G) to enhance its coatability, if desired.

The kind of the surfactant is not limited. Examples thereof may include fluorine-based surfactants, silicon-based surfactants, non-ionic surfactants, and the like.

Specific examples of the surfactant (G) may include fluorine- and silicon-based surfactants such as FZ-2122 supplied by Dow Corning Toray Co., Ltd., BM-1000 and BM-1100 supplied by BM CHEMIE Co., Ltd., Megapack F-142 D, F-172, F-173, and F-183 supplied by Dai Nippon Ink Chemical Kogyo Co., Ltd., Florad FC-135, FC-170 C, FC-430, and FC-431 supplied by Sumitomo 3M Ltd., Sufron S-112, S-113, S-131, S-141, S-145, S-382, SC-101, SC-102, SC-103, SC-104, SC-105, and SC-106 supplied by Asahi Glass Co., Ltd., Eftop EF301, EF303, and EF352 supplied by Shinakida Kasei Co., Ltd., SH-28 PA, SH-190, SH-193, SZ-6032, SF-8428, DC-57, and DC-190 supplied by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like; polyoxyethylene aryl ethers including polyoxyethylene octylphenyl ether, polyoxyethylene nonylphenyl ether, and the like; and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth) acrylate-based copolymer Polyflow Nos. 57 and 95 (manufactured by Kyoei Yuji Chemical Co., Ltd.), and the like. They may be used alone or in combination of two or more thereof.

The surfactant (G) may be employed in an amount of 0.001 to 5 parts by weight, 0.05 to 3 parts by weight, or 0.2 to 2 parts by weight, based on 100 parts by weight of the acrylic copolymer (A) on the basis of the solids content. Within the above content range, the coating and leveling characteristics of the composition may be good.

(H) Solvent

The positive-type photosensitive resin composition of the present invention may be prepared in the form of a liquid composition in which the above components are mixed with a solvent. The solvent may be, for example, an organic solvent.

The amount of the solvent (H) in the positive-type photosensitive resin composition according to the present invention is not particularly limited. For example, the solvent may be employed such that the solids content is 10 to 70% by weight or 15 to 60% by weight based on the total weight of the composition.

The term solids content refers to the components that constitute the composition, exclusive of solvents. If the amount of the solvent is within the above range, the coating of the composition can be readily carried out, while the flowability thereof can be maintained at a proper level.

The solvent (H) of the present invention is not particularly limited as long as it can dissolve the above-mentioned components and is chemically stable.

For example, the solvent may be alcohols, ethers, glycol ethers, ethylene glycol alkyl ether acetates, diethylene glycol, propylene glycol monoalkyl ethers, propylene glycol alkyl ether acetates, propylene glycol alkyl ether propionates, aromatic hydrocarbons, ketones, esters, or the like.

Particular examples of the solvent (H) include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among the above are ethylene glycol alkyl ether acetates, diethylene glycols, propylene glycol monoalkyl ethers, propylene glycol alkyl ether acetates, ketones and the like. In particular, preferred are diethylene glycol dimethyl ether, diethylene glycol ethyl methyl ether, dipropylene glycol dimethyl ether, dipropylene glycol diethyl ether, propylene glycol monomethyl ether, propylene glycol monoethyl ether, propylene glycol methyl ether acetate, methyl 2-methoxypropionate, γ-butyrolactone, 4-hydroxy-4-methyl-2-pentanone, and the like.

The solvents exemplified above may be used alone or in combination of two or more thereof.

In addition, the photosensitive resin composition of the present invention may further comprise other additives as long as the physical properties of the photosensitive resin composition are not adversely affected.

The photosensitive resin composition according to the present invention may be used as a positive-type photosensitive resin composition. Further, the present invention provides a cured film formed from the positive-type photosensitive resin composition.

The cured film may be formed by a method known in the art, for example, a method in which the photosensitive resin composition is coated on a substrate and then cured.

More specifically, in the curing step, the photosensitive resin composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution to form a pattern on the coating layer. Thereafter, the patterned coating layer, if necessary, is subjected to post-bake, for example, at a temperature of 150 to 300° C. for 10 minutes to 5 hours to prepare a desired cured film. The exposure to light may be carried out at an exposure rate of 10 to 200 mJ/cm$^2$ based on a wavelength of 365 nm in a wavelength band of 200 to 500 nm. According to the process of the present invention, it is possible to easily form a desired pattern from the viewpoint of the process.

The coating of the photosensitive resin composition onto a substrate may be carried out by a spin coating method, a slit coating method, a roll coating method, a screen printing method, an applicator method, or the like, in a desired thickness of, e.g., 2 to 25 μm. In addition, as a light source used for the exposure (irradiation), a low-pressure mercury lamp, a high-pressure mercury lamp, an extra high-pressure mercury lamp, a metal halide lamp, an argon gas laser, or the like may be used. X-ray, electronic ray, or the like may also be used, if desired.

Meanwhile, the photosensitive resin composition may be subjected to photobleaching at an energy of 300 to 2,000 mJ/cm$^2$ or 500 to 1,500 mJ/cm$^2$ after the exposure to light and development to obtain a more transparent cured film. Specifically, the composition may be coated on a substrate and subjected to the exposure to light and development steps, followed by photobleaching and hard-bake thereof to form a cured film. The photobleaching step removes the ionic bonds between the acrylic copolymer (A), which is one of the major components of the positive-type photosensitive resin composition, and the 1,2-quinonediazide compound (D), thereby forming a transparent cured film. If the hard-bake is carried out without the photobleaching step, a reddish cured film is obtained, so that the transmittance in the region of, for example, 400 to 600 nm is deteriorated.

The photosensitive resin composition of the present invention is capable of providing a cured film having excellent physical properties in terms of sensitivity, film retention rate, film strength, and the like upon development and upon hard-bake.

In particular, when the cured film is pressed to a thickness of 0.3 μm at a rate of 0.03 μm/s using a Vickers indenter, the film strength according to the following Equation 1 may be 300 to 400 N/mm$^2$ (See Example 3).

Film strength ($H$)=maximum force during pressing ($P$max)/area of Vickers indenter ($A$)     [Equation 1]

As described above, the positive-type photosensitive resin composition comprises a photopolymerizable compound containing a double bond and a specific photopolymerization initiator, wherein the photopolymerizable compound containing a double bond suppresses the photopolymerization reaction upon exposure to light but causes the photopolymerization reaction at the time of photobleaching after development, thereby controlling the flowability of the composition during thermal curing. Thus, a pattern is readily formed, which makes it possible to maintain excellent sensitivity upon the development and even upon the hard-bake process after the development, as well as the difference between the sensitivity upon development and that upon hard-bake is not large, the flowability of the cured film can be controlled and the surface characteristics can be further improved, and it is possible to provide a cured film that is excellent in film strength and film retention rate. Thus, the cured film prepared therefrom can be advantageously used in a liquid crystal display, an organic EL display, and the like.

MODE FOR THE INVENTION

Hereinafter, the present invention will be described in more detail with reference to the following examples. However, these examples are provided to illustrate the present invention, and the scope of the present invention is not limited thereto only.

In the following preparation examples, the weight average molecular weight is determined by gel permeation chromatography (GPC, eluent: tetrahydrofuran) referenced to a polystyrene standard.

Preparation Example 1: Preparation of a Copolymer (A-1)

A 500-ml, round-bottomed flask equipped with a refluxing condenser and a stirrer was charged with 100 g of a monomer mixture composed of 19% by mole of methacrylic acid, 15% by mole of glycidyl methacrylate, 20% by mole of styrene, 32% by mole of methyl methacrylate, and 14% by mole of methacrylate, along with 300 g of propylene glycol methyl ether acetate (PGMEA) as a solvent and 2 g of 2,2'-azobis(2,4-dimethylvaleronitrile) as a radical polymerization initiator. The mixture was then heated to 70° C. and stirred for 5 hours to obtain a copolymer having a solids content of 32% by weight. The copolymer thus prepared had an acid value of 25 mg KOH/g and a weight average molecular weight (Mw) of 10,000 Da.

Preparation Examples 2 and 3: Preparation of Copolymers (A-2 and A-3)

Copolymers (A-2 and A-3) were prepared in the same manner as in Preparation Example 1, except that the kinds and/or the contents of the monomers were changed as shown in Table 1 below.

TABLE 1

| Copolymer (A) | Sty (% by mole) | MAA (% by mole) | GMA (% by mole) | ECMM (% by mole) | MMA (% by mole) | MA (% by mole) | Acid value (mg KOH/g) | Weight average molecular weight (Da) |
|---|---|---|---|---|---|---|---|---|
| A-1 | 20 | 19 | 15 | — | 32 | 14 | 25 | 10,000 |
| A-2 | 20 | 21 | 15 | — | 30 | 14 | 32 | 12,000 |
| A-3 | 20 | 20 | — | 15 | 31 | 14 | 28 | 10,000 |

Sty: styrene; MAA: methacrylic acid; GMA: glycidyl methacrylate; ECMM: 3,4-epoxycyclohexylmethyl methacrylate; MMA: methyl methacrylate; MA: methacrylate.

Preparation Example 4: Preparation of an Epoxy Compound (E)

A three-necked flask was equipped with a cooling tube and placed on a stirrer equipped with a thermostat. The flask was charged with 100 parts by weight of a monomer composed of 100% by mole of 3,4-epoxycyclohexylmethyl methacrylate, 10 parts by weight of 2,2'-azobis(2-methyl-butyronitrile), and 100 parts by weight of PGMEA, followed by charging nitrogen thereto. Thereafter, the temperature of the solution was raised to 80° C. while it was slowly stirred, and this temperature was maintained for 5 hours to synthesize an epoxy compound having a weight average molecular weight of 9,500 Da. Then, PGMEA was added such that the solids content was 20% by weight.

Examples and Comparative Examples: Preparation of Photosensitive Resin Compositions The photosensitive resin compositions of the following Examples and Comparative Examples were prepared using the compounds prepared in the above Preparation Examples.

The components used in the following Examples and Comparative Examples are as follows.

TABLE 2

| | | Compound and/or brand name | Manufacturer | Solids content (% by weight) |
|---|---|---|---|---|
| Copolymer (A) | A-1 | Preparation Ex. 1 | — | 32 |
| | A-2 | Preparation Ex. 2 | — | 32 |
| | A-3 | Preparation Ex. 3 | — | 32 |
| Photopolymerizable compound (B) | | Dipentaerythritol hexaacrylate (DPHA) | Nippon Kayaku | 100 |
| Photo-polymerization initiator | C-1 | Omnirad 500 | IGM | 100 |
| | C-2 | PI-1173 | IGM | 100 |
| | C-3 | Omnirad 659 | IGM | 100 |
| | C-4 | Irgacure 127 | BASF | 100 |
| | C-5 | N1919 | Adeka | 100 |
| 1,2-quinonediazide compound | D-1 | THA-523 | Miwon | 100 |
| | D-2 | TPA-523 | Miwon | 100 |
| Epoxy compound (E) | | GHP24HP | Miwon | 100 |
| Adhesion supplement (F) | | Sila-Ace XS1075 | JNC | 100 |
| Surfactant (G) | | FZ-2122 | Dow Corning Toray | 100 |
| Solvent (H) | H-1 | Propylene glycol methyl ether acetate (PGMEA) | Chemtronics | — |
| | H-2 | Methyl 3-methoxypropionate (MMP) | Hannong | — |

Example 1

100 parts by weight of an acrylic copolymer (A) as a mixture of 37.5% by weight of the acrylic copolymer (A-1) of Preparation Example 1, 37.5% by weight of the acrylic copolymer (A-2) of Preparation Example 2, and 25% by weight of the acrylic copolymer (A-3) of Preparation Example 3, 15.5 parts by weight of DPHA as a photopolymerizable compound (B), 3.6 parts by weight of Omnirad 500 (C-1) as a photopolymerization initiator, 8.4 parts by weight of THA-523 (D-1) and 7.1 parts by weight of TPA-523 (D-2) as a 1,2-quinonediazide compound, 3.1 parts by weight of the epoxy compound (E) of Preparation Example 4, 0.4 part by weight of Sila-Ace XS 1075 as an adhesion supplement (F), and 0.2 parts by weight of FZ-2122 as a surfactant (G) were homogeneously mixed. In such event, the respective contents are those based on the solids content exclusive of the solvent. The mixture was dissolved in a mixed solvent of PGMEA and MMP (PGMEA:MMP=93:7) such that the solids content of the mixture was 22% by weight. The resultant was stirred for 2 hours and filtered through a membrane filter having a pore size of 0.2 μm to obtain a photosensitive resin composition solution having a solids content of 22% by weight.

Examples 2 to 7 and Comparative Examples 1 to 4

Photosensitive resin composition solutions were prepared in the same manner as in Example 1, except that the kinds and/or the contents of the respective components were changed as shown in Table 3 below.

TABLE 3

| | | Ex. 1 | Ex. 2 | Ex. 3 | Ex. 4 | Ex. 5 | Ex. 6 | Ex. 7 | C. Ex. 1 | C. Ex. 2 | C. Ex. 3 | C. Ex. 4 |
|---|---|---|---|---|---|---|---|---|---|---|---|---|
| Copolymer (A) | A-1 | 37.5 | 37.5 | 37.5 | 37.5 | 47.2 | 59.5 | 75 | 37.5 | 37.5 | 37.5 | 37.5 |
| | A-2 | 37.5 | 37.5 | 37.5 | 37.5 | 27.8 | 15.5 | — | 37.5 | 37.5 | 37.5 | 37.5 |
| | A-3 | 25 | 25 | 25 | 25 | 25 | 25 | 25 | 25 | 25 | 25 | 25 |

TABLE 3-continued

| | | Ex. 1 | Ex. 2 | Ex. 3 | Ex. 4 | Ex. 5 | Ex. 6 | Ex. 7 | C. Ex. 1 | C. Ex. 2 | C. Ex. 3 | C. Ex. 4 |
|---|---|---|---|---|---|---|---|---|---|---|---|---|
| Photopolymerizable compound (B) | | 15.5 | 15.5 | 15.5 | 15.5 | 15.5 | 15.5 | 15.5 | — | — | 15.5 | 15.5 |
| Photopolymerization initiator | C-1 | 3.6 | — | — | — | — | — | — | — | — | — | — |
| | C-2 | — | 3.1 | — | — | — | — | — | — | — | — | — |
| | C-3 | — | — | 4.2 | — | 4.2 | 4.2 | 4.2 | — | 4.2 | — | — |
| | C-4 | — | — | — | 6.4 | — | — | — | — | — | — | — |
| | C-5 | — | — | — | — | — | — | — | — | — | — | 10.2 |
| 1,2-quinonediazide compound | D-1 | 8.4 | 8.4 | 8.4 | 8.4 | 8.4 | 8.4 | 8.4 | 8.4 | 8.4 | 8.4 | 8.4 |
| | D-2 | 7.1 | 7.1 | 7.1 | 7.1 | 7.1 | 7.1 | 7.1 | 7.1 | 7.1 | 7.1 | 7.1 |
| Epoxy compound (E) | | 3.1 | 3.1 | 3.1 | 3.1 | 3.1 | 3.1 | 3.1 | 3.1 | 3.1 | 3.1 | 3.1 |
| Adhesion supplement (F) | | 0.4 | 0.4 | 0.4 | 0.4 | 0.4 | 0.4 | 0.4 | 0.4 | 0.4 | 0.4 | 0.4 |
| Surfactant (G) | | 0.2 | 0.2 | 0.2 | 0.2 | 0.2 | 0.2 | 0.2 | 0.2 | 0.2 | 0.2 | 0.2 |
| Solvent (H) | | | | | | Balance | | | | | | |

Test Example 1: Measurement of the Absorbance of a Photopolymerization Initiator (C)

Each of the photopolymerization initiators C-1 to C-5 (Omnirad 500, PI-1173, Omnirad 659, Irgacure 127, and N1919) used in the above Examples and Comparative Examples was dissolved in PGMEA to a concentration of 0.5 mM. The absorbance of the solution was measured under the conditions of 23° C. and an optical path length of 10 mm. The results are shown in FIG. 1.

Referring to FIG. 1, all of the photopolymerization initiators except for C-5 (N1919) showed an absorbance of 4.0 or less in the entire wavelength range.

Test Example 2: Evaluation of Sensitivity

The compositions prepared in the Examples and the Comparative Examples were each coated onto a glass substrate by spin coating. The coated substrate was then pre-baked on a hot plate kept at 100° C. for 150 seconds to remove the solvent, thereby forming a dry film. A mask having a pattern of square holes and lines in a size ranging from 1 μm to 20 μm, wherein the same pattern array is made in a gray scale, was placed on the dried film. Thereafter, the film was exposed to light at an exposure rate of 0 to 300 mJ/cm² based on a wavelength of 365 nm for a certain time period using an aligner (model name: MA6) that emits light having a wavelength of 200 nm to 450 nm. It was then developed for 90 seconds with a developer, which was an aqueous solution of 0.4% by weight of tetramethylammonium hydroxide, through puddle nozzles at 23° C. In such event, for the hole pattern formed per a mask size of 20 μm, the amount of exposure energy (optimum Energy; EOP, unit: mJ/cm²) for attaining a critical dimension (CD, unit: μm) of 19 μm was measured. The lower the exposure energy, the better the sensitivity. Since the amount of exposure energy was measured upon the development, it is referred to as a sensitivity upon development.

Thereafter, the developed film was subjected to bleaching by exposing it to light at an exposure rate of 1,000 mJ/cm² based on a wavelength of 365 nm for a certain time period using an aligner (model name: MA6) that emits light having a wavelength of 200 nm to 450 nm. The exposed film thus obtained was heated in a convection oven at 240° C. for 30 minutes to prepare a cured film having a thickness of 3.0 μm (i.e., hard-bake step). Here, the amount of exposure energy was obtained in the same manner as the method of determining the amount of exposure energy upon development. Since the amount of exposure energy was measured upon the hard-bake step, it was referred to as a sensitivity upon hard-bake (or a sensitivity upon HB).

The flowability of a cured film is further suppressed as the difference between the sensitivity upon development and the sensitivity upon hard-bake (i.e., sensitivity upon hard-bake—sensitivity upon development: Δ sensitivity) is smaller.

Test Example 3: Evaluation of Film Strength

The compositions prepared in the Examples and the Comparative Examples were each coated onto a glass substrate by spin coating. The coated substrate was then pre-baked on a hot plate kept at 100° C. for 150 seconds, thereby forming a dry film. It was then developed for 90 seconds with a developer, which was an aqueous solution of 0.4% by weight of tetramethylammonium hydroxide, through puddle nozzles at 23° C. Thereafter, the film was exposed to light at an exposure rate of 1,000 mJ/cm² based on a wavelength of 365 nm for a certain time period using an aligner (model name: MA6) that emits light having a wavelength of 200 nm to 450 nm. The film was then heated in a convection oven at 240° C. for 30 minutes to prepare a cured film having a thickness of 3.0 μm. The cured film was pressed to a thickness of 0.3 μm at a rate of 0.03 μm/s using a Vickers indenter of a nanoindenter (Fischerscope HM2000LT, Fisher Technologies) to measure the value obtained by dividing the maximum force ($P_{max}$) by the indenter area (A). The larger the value, the higher the film strength.

Film strength($H$)=maximum force during pressing ($P_{max}$)/area of Vickers indenter($A$) [Equation 1]

Test Example 4: Measurement of Film Retention Rate

The cured films prepared in Test Example 3 were each measured for the film retention rate in the following manner. Specifically, the film retention rate (%) was obtained from the following Equation 2 by calculating the ratio in a percent of the thickness of the film after the pre-bake to that of the film after the hard-bake by using a measuring instrument (SNU Precision). The higher the numerical value, the better the film retention rate.

Film retention rate (%)=(thickness of film upon hard-bake/thickness of film upon pre-bake)×100 [Equation 2]

TABLE 4

| | Film retention rate (%) | Sensitivity (mJ/cm²) | | | Film strength (N/mm²) |
| --- | --- | --- | --- | --- | --- |
| | | Upon development | Upon hard-bake | Δ sensitivity | |
| Ex. 1 | 71 | 60 | 165 | 105 | 354 |
| Ex. 2 | 69 | 60 | 195 | 135 | 355.4 |
| Ex. 3 | 68 | 60 | 90 | 30 | 337.7 |
| Ex. 4 | 57 | 45 | 150 | 105 | 333.8 |
| Ex. 5 | 71 | 60 | 90 | 30 | 370.3 |
| Ex. 6 | 74 | 60 | 105 | 45 | 359.2 |
| Ex. 7 | 77 | 60 | 150 | 90 | 341.6 |
| C. Ex. 1 | 76 | 105 | 120 | 15 | 317.1 |
| C. Ex. 2 | 71 | 105 | 120 | 15 | 290.1 |
| C. Ex. 3 | 75 | 60 | 210 | 150 | 372.7 |
| C. Ex. 4 | 82 | — | — | — | 358.8 |

As shown in Table 4, all of the cured films prepared from the compositions of the Examples, falling within the scope of the present invention, had a high level of hardness since they had a film hardness of 330 N/mm² or more. In addition, the cured films had excellent sensitivity upon development and even upon hard-bake, and the difference between the sensitivity upon development and the sensitivity upon hard-bake was maintained at an appropriate level, whereby the flowability of the cured films at the time of hard-bake was expected to be appropriately controlled. In addition, the film retention rates were as excellent as about 70%.

In contrast, the cured films prepared from the compositions of Comparative Example 1 (without a photopolymerization initiator and a photopolymerizable compound containing a double bond) and Comparative Example 2 (with a photopolymerization initiator and without a photopolymerizable compound containing a double bond) were poor in terms of the sensitivity upon development and the film strength. The cured film prepared from the composition of Comparative Example 3 (without a photopolymerization initiator and with a photopolymerizable compound containing a double bond) had a large difference between the sensitivity upon development and the sensitivity upon hard-bake, which is disadvantageous from the viewpoint of controlling the flowability of the cured film at the time of the hard-bake. In addition, in Comparative Example 4, in which a photopolymerization initiator falling outside the scope of the present invention was used, it was not able to measure the sensitivity upon development and that upon hard-bake.

The invention claimed is:

1. A positive-type photosensitive resin composition, which comprises:
   (A) an acrylic copolymer;
   (B) a photopolymerizable compound containing a double bond;
   (C) a photopolymerization initiator; and
   (D) a 1,2-quinonediazide compound,
   wherein when the absorbance of the photopolymerization initiator (C) dissolved in propylene glycol methyl ether acetate (PGMEA) at a concentration of 0.5 mM is measured under the conditions of 23° C. and an optical path length of 10 mm, the maximum absorbance in the entire wavelength range is 4.0 or less.

2. The positive-type photosensitive resin composition of claim 1, wherein the acrylic copolymer (A) comprises (a-1) a structural unit derived from an ethylenically unsaturated carboxylic acid, an ethylenically unsaturated carboxylic anhydride, or a combination thereof; (a-2) a structural unit derived from an unsaturated compound containing an epoxy group; and (a-3) a structural unit derived from an ethylenically unsaturated compound different from the structural units (a-1) and (a-2).

3. The positive-type photosensitive resin composition of claim 1, wherein the acrylic copolymer (A) has an acid value of 10 to 40 mg KOH/g.

4. The positive-type photosensitive resin composition of claim 1, which comprises the photopolymerizable compound (B) in an amount of 2 to 50 parts by weight based on 100 parts by weight of the acrylic copolymer (A) on the basis of the solids content.

5. The positive-type photosensitive resin composition of claim 1, wherein the photopolymerization initiator (C) is a compound represented by the following Formula 1:

[Formula 1]

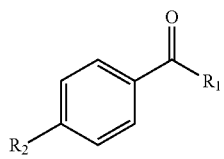

in the above Formula,
R₁ is $C_{1-20}$ alkyl, $C_{3-20}$ cycloalkyl, $C_{6-30}$ aryl, or $C_{1-20}$ hydroxyalkyl, wherein when R₁ is an alkyl group, a cycloalkyl group, an aryl group, or a hydroxyalkyl group, some or all of the hydrogen atoms may be substituted with a $C_{1-20}$ alkyl group or a hydroxy group,
R₂ is hydrogen or

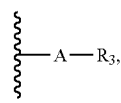

and
A is $C_{1-10}$ alkylene or oxygen, R₃ is $C_{1-20}$ alkyl, $C_{3-20}$ cycloalkyl, $C_{6-30}$ aryl, or $C_{1-20}$ hydroxyalkyl, wherein when R₃ is an alkyl group, a cycloalkyl group, an aryl group, or a hydroxyalkyl group, some or all of the hydrogen atoms may be substituted with a $C_{1-20}$ alkyl group, a hydroxy group, or a $C_{1-20}$ hydroxyalkylcarbonyl group.

6. The positive-type photosensitive resin composition of claim 1, which comprises the photopolymerization initiator (C) in an amount of 1 to 30 parts by weight based on 100 parts by weight of the acrylic copolymer (A) on the basis of the solids content.

7. The positive-type photosensitive resin composition of claim 1, which comprises the 1,2-quinonediazide-based compound (D) in an amount of 2 to 50 parts by weight based on 100 parts by weight of the acrylic copolymer (A) on the basis of the solids content.

8. The positive-type photosensitive resin composition of claim 1, which further comprises an epoxy compound (E).

* * * * *